United States Patent
Huang

(10) Patent No.: US 8,928,366 B2
(45) Date of Patent: Jan. 6, 2015

(54) METHOD AND APPARATUS FOR REDUCING CROWBAR CURRENT

(71) Applicant: QUALCOMM Incorporated, San Diego, CA (US)

(72) Inventor: Yu Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 88 days.

(21) Appl. No.: 13/742,925

(22) Filed: Jan. 16, 2013

(65) Prior Publication Data

US 2014/0197879 A1    Jul. 17, 2014

(51) Int. Cl.
    *H03K 3/00*            (2006.01)
    *H03K 17/687*      (2006.01)

(52) U.S. Cl.
    CPC ................................. *H03K 17/687* (2013.01)
    USPC .......................................... 327/112; 327/108

(58) Field of Classification Search
    USPC .......... 327/108, 109, 110, 112, 427, 434, 437
    See application file for complete search history.

(56) References Cited

U.S. PATENT DOCUMENTS

| | | | |
|---|---|---|---|
| 5,191,245 A * | 3/1993 | Kang | ............................ 327/262 |
| 5,796,313 A | 8/1998 | Eitan | |
| 6,097,253 A | 8/2000 | Hissen | |
| 6,255,867 B1 * | 7/2001 | Chen | ............................ 327/108 |
| 6,278,290 B1 | 8/2001 | Young | |
| 6,650,594 B1 | 11/2003 | Lee et al. | |
| 7,064,596 B1 | 6/2006 | Smith et al. | |
| 7,317,333 B1 | 1/2008 | Zhou et al. | |

OTHER PUBLICATIONS

Bazes M., "Two Novel Fully Complementary Self-Biased CMOS Differential Amplifiers", IEEE Journal of Solid-State Circuits,vol. 26,No. 2,1991 ,pp. 165-168.
Zhang, et al., "A New Level Shifter with Low Power in Multi-Voltage System", 8th International Conference on Solid-State and Integrated Circuit Technology, 2006, 3 pgs.

\* cited by examiner

*Primary Examiner* — Hai L Nguyen
(74) *Attorney, Agent, or Firm* — Novak Druce Connolly Bove + Quigg LLP

(57) ABSTRACT

Techniques for reducing crowbar current are disclosed. In one embodiment, a circuit for reducing crowbar current comprises an inverter having an input and an output, a first switch coupled between the inverter and a first power supply rail, and a second switch coupled between the inverter and a second power supply rail. The circuit also comprises a feedback circuit coupled to the output of the inverter, wherein the feedback circuit is configured to turn off the first switch when the output of the inverter is in a low output state, and to turn off the second switch when the output of the inverter is in a high output state.

24 Claims, 5 Drawing Sheets

METHOD AND APPARATUS FOR REDUCING CROWBAR CURRENT

BACKGROUND

1. Field

Aspects of the present disclosure relate generally to reducing power consumption, and more particularly, to reducing crowbar current.

2. Background

Mobile devices (e.g., smartphones) may provide users with voice and data communication, web browsing, etc. A mobile device is typically powered by a battery that may have a limited energy-storage capacity due to the small size and/or light weight of the mobile device. Therefore, it is important to minimize power consumption in the mobile device to extend the life of the battery.

One source of power consumption in a mobile device may be crowbar current. Crowbar current occurs when current flows from an upper power supply rail straight to a lower supply rail (e.g., ground) without providing a useful function, thereby wasting power. Accordingly, it is desirable to reduce crowbar current in a mobile device to reduce power consumption, and extend the battery life of the mobile device.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a circuit for reducing crowbar current is described herein. The circuit comprises an inverter having an input and an output, a first switch coupled between the inverter and a first power supply rail, and a second switch coupled between the inverter and a second power supply rail. The circuit also comprises a feedback circuit coupled to the output of the inverter, wherein the feedback circuit is configured to turn off the first switch when the output of the inverter is in a low output state, and to turn off the second switch when the output of the inverter is in a high output state.

A second aspect relates to a method for reducing crowbar current in a circuit. The circuit includes an inverter having an input and an output, a first switch coupled between the inverter and a first power supply rail, and a second switch coupled between the inverter and a second power supply rail. The method comprises turning off the first switch when the output of the inverter is in a low output state, and turning off the second switch when the output of the inverter is in a high output state.

A third aspect relates to an apparatus for reducing crowbar current. The apparatus comprises means for inverting a signal, first means for switching coupled between the means for inverting and a first power supply rail, and second means for switching coupled between the means for inverting and a second power supply rail. The apparatus also comprises means for turning off the first means for switching when an output of the means for inverting is in a low output state, and means for turning off the second means for switching when the output of the means for inverting is in a high output state.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
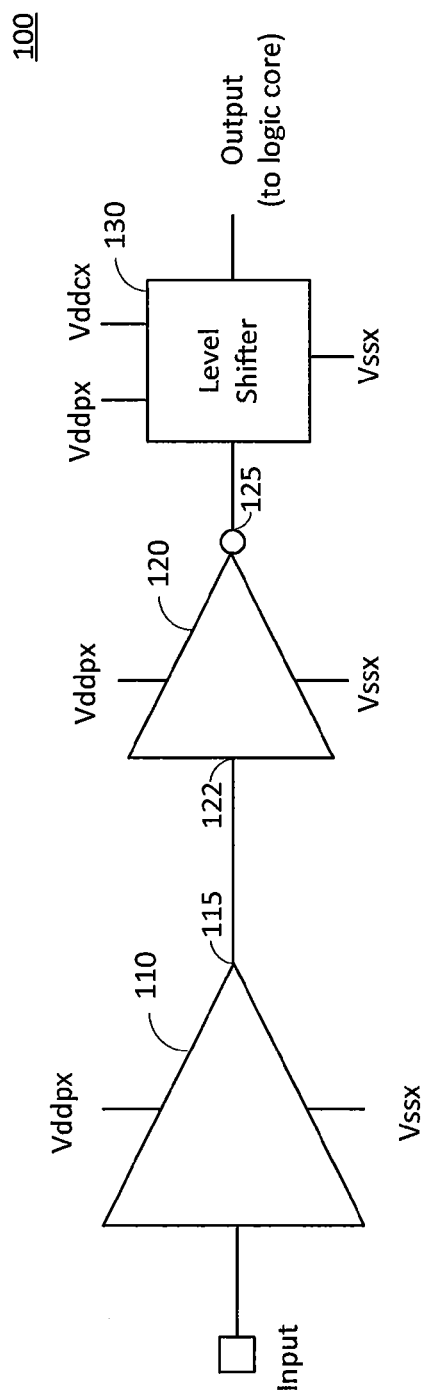
FIG. 1 shows an example of a receiver that may be used in a mobile device.
Figure 2:
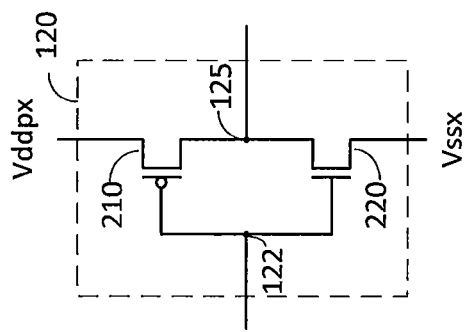
FIG. 2 shows an example of an inverter.

FIG. 1 shows an example of a receiver 100 that may be used in a mobile device. The receiver 100 may be integrated on a chip that includes input/output (I/O) circuitry and logic-core circuitry, in which the I/O circuitry interfaces the logic-core circuitry with one or more external chips. The I/O circuitry may be powered by a first power supply having an upper voltage of Vddpx and a lower voltage of Vssx, and the logic-core circuitry may be powered by a second power supply having an upper voltage of Vddcx and a lower voltage of Vssx, in which Vddpx is higher than Vddcx.

The receiver 100 may be part of the I/O circuitry of the chip and configured to interface the logic-core circuitry of the chip with an external memory chip, for example, a dynamic random access memory (DRAM) chip. The receiver 100 comprises an amplifier 110, an inverter 120, and a level shifter 130. The amplifier 110 amplifies an input signal (e.g., data signal and/or control signal) from the external memory chip, and the inverter 120 inverts the output 115 of the amplifier 110. The level shifter 130 shifts the voltage swing (Vddpx to Vssx) at the output 125 of the inverter 120 to the lower voltage swing (Vddcx to Vssx) of the logic-core circuitry (not shown) for processing by the logic-core circuitry.

The output 115 of the amplifier 110 may not have a full rail-to-rail voltage swing (Vddpx to Vssx). As a result, the high voltage at the amplifier output 115 may be below Vddpx and the low voltage at the amplifier output 115 may be above Vssx. The reduced voltage swing at the amplifier output 115 may cause crowbar current to flow in the inverter 120. This may be explained by way of example with reference to FIG.

2, in which the inverter 120 is a complimentary metal-oxide-semiconductor (CMOS) inverter comprising a p-type metal-oxide-semiconductor (PMOS) transistor 210 and an n-type metal-oxide-semiconductor (NMOS) transistor 220. In this example, the gates of the PMOS transistor 210 and the NMOS transistor 220 are coupled to the input 122 of the inverter 120, and the drains of the PMOS transistor 210 and the NMOS transistor 220 are coupled to the output 125 of the inverter 120.

Ideally, when the voltage at the amplifier output 115 is high, the NMOS transistor 220 is turned on and the PMOS transistor 210 is turned off to produce a logic zero at the inverter output 125. However, because the high voltage at the amplifier output 115 is below Vddpx, the voltage at the gate of the PMOS transistor 210 is below Vddpx. As a result, there is a voltage drop between the source of the PMOS transistor 210 (which is at Vddpx) and the gate of the PMOS transistor 210. This voltage drop may cause the PMOS transistor 210 to weakly turn on. As a result, both the PMOS transistor 210 and the NMOS transistor 220 are turned on, and crowbar current flows from Vddpx to Vssx through the PMOS transistor 210 and the NMOS transistor 220 of the inverter 120.

Ideally, when the voltage at the amplifier output 115 is low, the PMOS transistor 210 is turned on and the NMOS transistor 220 is turned off to produce a logic one at the inverter output 125. However, because the low voltage at the amplifier output 115 is above Vssx, the voltage at the gate of the NMOS transistor 220 is above Vssx. As a result, there is a voltage drop between the gate of the NMOS transistor 220 and the source of the NMOS transistor 220 (which is at Vssx). This voltage drop may cause the NMOS transistor 220 to weakly turn on. As a result, both the PMOS transistor 210 and the NMOS transistor 220 are turned on, and crowbar current flows from Vddpx to Vssx through the PMOS transistor 210 and the NMOS transistor 220 of the inverter 120.

The crowbar current in the inverter 120 consumes power, thereby reducing the battery life of the mobile device. Accordingly, it is desirable to reduce the crowbar current in order to increase the battery life of the mobile device.

Figure 3:
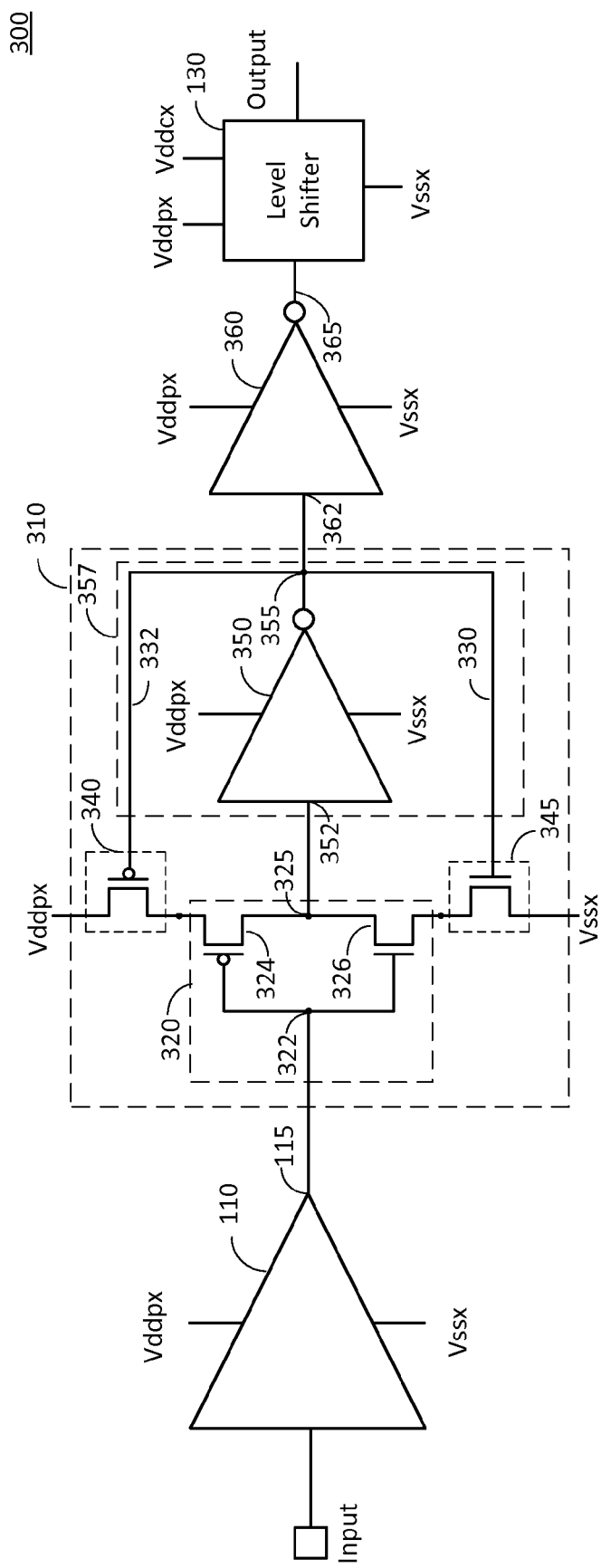
FIG. 3 shows a circuit for reducing crowbar current according to an embodiment of the present disclosure.

FIG. 3 shows a receiver 300 with reduced crowbar current according to an embodiment of the present disclosure. The receiver 300 comprises a circuit 310 for reducing crowbar current in the receiver 300. The circuit 310 includes a first inverter 320, a second inverter 350, a first switch 340 coupled between Vddpx and the first inverter 320, and a second switch 345 coupled between the first inverter 320 and Vssx. The first inverter 320 may comprise a PMOS transistor 324 and an NMOS transistor 326, as shown in the example in FIG. 3. The receiver 300 also comprises a third inverter 360 coupled between the second inverter 350 and the level shifter 130.

The output 325 of the first inverter 320 is coupled to the input 352 of the second inverter 350, the output 355 of the second inverter 350 is coupled to the input 362 of the third inverter 360, and the output 365 of the third inverter 360 is coupled to the level shifter 130. The output 365 of the third inverter 360 outputs the inverse of the amplifier output 115, similar to the inverter 120 in FIG. 1.

The output 355 of the second inverter 350 is also coupled to the first switch 340 via a first feedback path 332, and to the second switch 345 via a second feedback path 330. In the example shown in FIG. 3, the first switch 340 comprises a PMOS transistor having a source coupled to Vddpx, a drain coupled to the first inverter 320, and a gate coupled to the output 355 of the second inverter 350 via the first feedback path 332. The second switch 345 comprises an NMOS transistor having a drain coupled to the first inverter 320, a source coupled to Vssx, and a gate coupled to the output 355 of the second inverter 350 via the second feedback path 330.

In operation, when the output 115 of the amplifier 110 is in a high output state, the output 325 of the first inverter 320 is in a low output state, and the output 355 of the second inverter 350 is in a high output state, in which a high output state may correspond to a logic one and a low output state may correspond to a logic zero. It is to be appreciated that the high output states of the amplifier 110, the first inverter 320, and the second inverter 350 do not necessarily correspond to the same voltage level. For example, the high output state of the first inverter 320 may correspond to a voltage level that is closer to Vddpx, and therefore higher, than the high output state of the amplifier 110 (e.g., when the amplifier output 115 does not have a full rail-to-rail voltage swing). Similarly, it is to be appreciated that the low output states of the amplifier 110, the first inverter 320, and the second inverter 350 do not necessarily correspond to the same voltage level.

The high output of the second inverter 350 (which is input to the gate of the PMOS transistor of the first switch 340) turns off the first switch 340. This shuts off current flow through the PMOS transistor 324 of the first inverter 320, thereby preventing crowbar current to flow from Vddpx to Vssx through the first inverter 320.

The high output of the second inverter 350 (which is input to the gate of the NMOS transistor of the second switch 345) turns on the second switch 345. This provides a current path between the output 325 of the first inverter 320 and Vssx, allowing the output 325 of the first inverter 320 to be pulled down to approximately Vssx for a logic zero at the output 325 of the first inverter 320.

When the output 115 of the amplifier 110 is in a low output state, the output 325 of the first inverter 320 is in a high output state, and the output 355 of the second inverter 350 is in a low output state. The low output of the second inverter 350 (which is input to the gate of the NMOS transistor of the second switch 345) turns off the second switch 345. This shuts off current flow through the NMOS transistor 326, thereby preventing crowbar current to flow from Vddpx to Vssx through the first inverter 320.

The low output of the second inverter 350 (which is input to the gate of the PMOS transistor of the first switch 340) turns on the first switch 340. This provides a current path between Vddpx and the output 325 of the first inverter 320, allowing the output 325 of the first inverter 320 to be pulled up to approximately Vddpx for a logic one at the output 325 of the first inverter 320.

Thus, the second inverter 350 and the feedback paths 330 and 332 form a feedback circuit 357 that controllably switches the first switch 340 and the second switch 345 to reduce crowbar current through the first inverter 320. The feedback circuit 357 turns off the first switch 340 when the output 325 of the first inverter 320 in the low output state. This shuts off current flow through the PMOS transistor 324 of the first inverter 320, thereby preventing crowbar current to flow from Vddpx to Vssx through the first inverter 320. The feedback circuit 357 turns off the second switch 345 when the output 325 of the first inverter 320 is in the high output state. This shuts off current flow through the NMOS transistor 326 of the first inverter 320, thereby preventing crowbar current to flow from Vddpx to Vssx through the first inverter 320.

Figure 4:
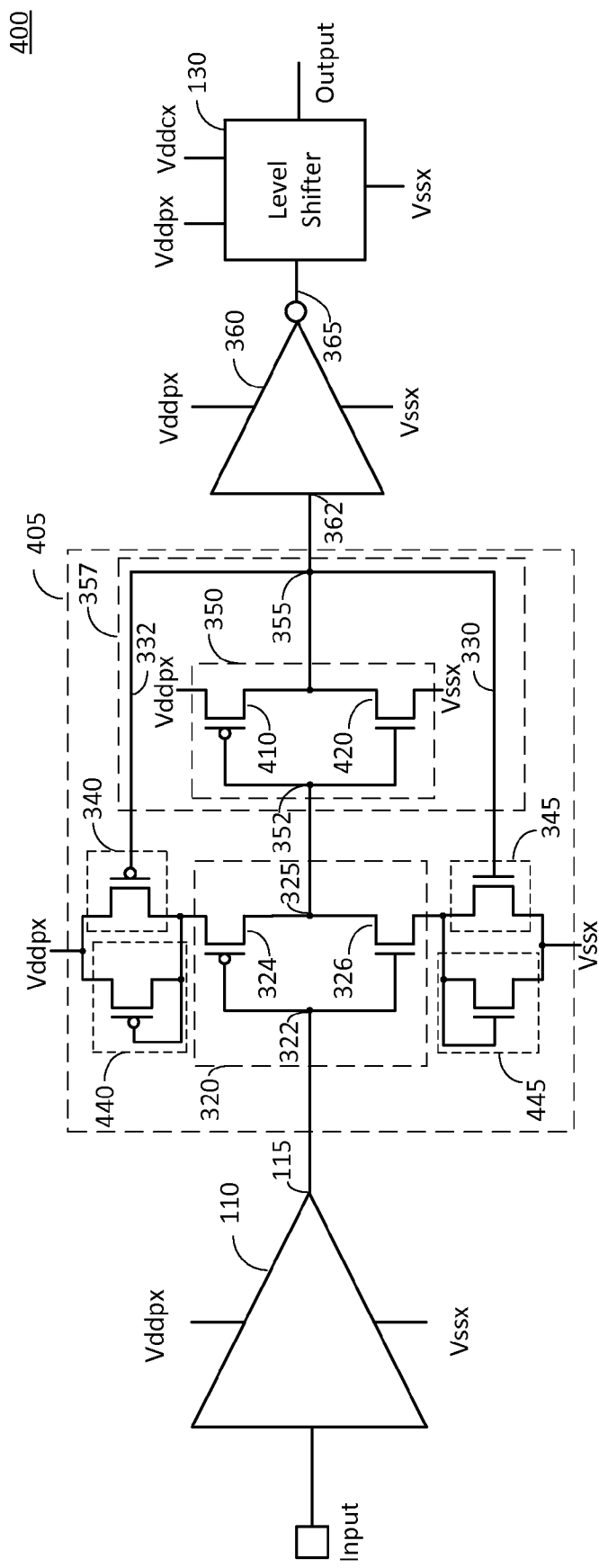
FIG. 4 shows trigger devices that facilitate transitioning an inverter between states according an embodiment of the present disclosure.

FIG. 4 shows a receiver 400 with reduced crowbar current according to an embodiment of the present disclosure. The receiver 400 includes a circuit 405 for reducing crowbar that is similar to the circuit 310 in FIG. 3, and further comprises a first trigger device 440 coupled between Vddpx and the first inverter 320, and a second trigger device 445 coupled between Vssx and the first inverter 320. The first trigger device 440 comprises a first diode (e.g., a diode-connected PMOS transistor), and the second trigger device 445 device comprises a second diode (e.g., a diode-connected NMOS transistor). In the example shown in FIG. 4, the second inverter 350 comprises a PMOS transistor 410 and an NMOS transistor 420.

The first trigger device 440 is configured to trigger a transition of the output 355 of the second inverter 350 from the high output state to the low output state when the output 115 of the amplifier 110 transitions from the high output state to the low output state, as explained further below.

To transition the output 355 of the second inverter 350 from the high output state to the low output state, current needs to flow from Vddpx to the input 352 of the second inverter 350 in order to charge the gate of the NMOS transistor 420 of the second inverter 350 and turn on the NMOS transistor 420 of the second inverter 350. However, when the amplifier output 115 initially transitions from the high output state to the low output state, the PMOS transistor of the first switch 340 is turned off, which prevents current flow from Vddpx to the input 352 of the second inverter 350.

To address this, the first trigger device 440 provides a current path from Vddpx to the input 352 of the second inverter 350 to charge up the gate of the NMOS transistor 420 before the first switch 340 turns on.

When the amplifier output 115 transitions from the high state to the low state, the input 322 of the first inverter 320 (which is coupled to the amplifier output 115) transitions from a high input state to a low input state. As the input 322 of the first inverter 320 transitions from the high input state to the low input state, the voltage across the first trigger device 440 increases. When this voltage reaches the turn-on voltage of the first diode of the first trigger device 440, the first trigger device 440 turns on and current begins to flow from Vddpx to the input 352 of the second inverter 350 through the first trigger device 440. For the example shown in FIG. 4, this may occur when the voltage difference between Vddpx and the input 322 of the second inverter 320 is approximately equal to the sum of the turn-on voltage of the first diode and the threshold voltage of the PMOS transistor 324.

The current flow through the first trigger device 440 charges the gate of the NMOS transistor 420 of the second inverter 350, causing the voltage at the input 352 to rise. When the voltage at the input 352 reaches the threshold voltage of the NMOS transistor 420, the NMOS transistor 420 turns on and begins pulling down the voltage at the output 355 of the second inverter 350 to the low output state. This, in turn, causes the PMOS transistor of the first switch 340 to turn on, allowing more current to flow from Vddpx to the input 352 of the second inverter 350 through the first switch 340.

The transition of the output 355 of the second inverter 350 from the high output state to the low output state accelerates when the first switch 340 turns on. This is because the feedback circuit 357 provides positive feedback that turns on the first switch 340 more, and therefore increases the current flow through the first switch 340, as the voltage at the input 352 of the second inverter 350 rises. The increased current flow, in turn, causes the voltage at the input 352 of the second inverter 350 to rise faster.

The second trigger device 445 is configured to trigger a transition of the output 355 of the second inverter 350 from the low output state to the high output state when the output 115 of the amplifier 110 transitions from the low output state to the high output state, as explained further below.

To transition the output 355 of the second inverter 350 from the low output state to the high output state, current needs to flow from the input 352 of the second inverter 350 to Vssx in order to discharge the gate of the PMOS transistor 410 of the second inverter 350 and turn on the PMOS transistor 410 of the second inverter 350. However, when the amplifier output 115 initially transitions from the low output state to the high output state, the NMOS transistor of the second switch 345 is turned off, which prevents current flow from the input 352 of the second inverter 350 to Vssx.

To address this, the second trigger device 445 provides a current path from the input 352 of the second inverter 320 to Vssx to discharge the gate of the PMOS transistor 410 of the second inverter 350 before the second switch 345 turns on.

When the amplifier output 115 transitions from the low state to the high state, the input 322 of the first inverter 320 (which is coupled to the amplifier output 115) transitions from the low input state to the high input state. As the input 322 of the first inverter 320 transitions from the low input state to the high input state, the voltage across the second trigger device 445 increases. When this voltage reaches the turn-on voltage of the second diode of the second trigger device 445, the second trigger device 445 turns on and current begins to flow from the input 352 of the second inverter 350 to Vssx through the second trigger device 445. For the example shown in FIG. 4, this may occur when the voltage difference between the input 322 of the first inverter 320 and Vssx is approximately equal to the sum of the turn-on voltage of the second diode and the threshold voltage of the NMOS transistor 326.

The current flow through the second trigger device 445 discharges the gate of the PMOS transistor 410 of the second inverter 350 causing the voltage at the input 352 to fall. When the voltage difference between Vddpx and the input 352 reaches the threshold voltage of the PMOS transistor 410, the PMOS transistor 410 turns on and begins pulling up the voltage at the output 355 of the second inverter 350 to the high output state. This, in turn, causes the NMOS transistor of the second switch 345 to turn on, allowing more current to flow from the input 352 of the second inverter 350 to Vssx through the second switch 345.

The transition of the output 355 of the second inverter 350 from the low output state to the high output state accelerates when the second switch 345 turns on. This is because the feedback circuit 357 provides positive feedback that turns on the second switch 345 more, and therefore increases the current flow through the second switch, as the voltage at the input 352 of the second inverter 350 falls. The increased current flow through the second switch 345, in turn, causes the voltage at the input 352 to fall faster.

Thus, the first trigger device 440 and the second trigger device 445 facilitate transitioning of the second inverter 350 between states. The first trigger device 440 facilitates transitioning of the second inverter 350 from the high output state to the low output state by providing a current path between Vddpx and the input 352 of the second inverter 350 for turning on the NMOS transistor 420 of the second inverter 350. This current path bypasses the first switch 340, and is therefore able to provide current to turn on the NMOS transistor 420 before the first switch 340 turns on.

The second trigger device 445 facilitates transitioning of the second inverter 350 from the low output state to the high output state by providing a current path between the input 352 of the second inverter 350 and Vssx for turning on the PMOS transistor 410 of the second inverter 350. This current path bypasses the second switch 345, and is therefore able to provide current to turn on the PMOS transistor 410 before the second switch 345 turns on.

Figure 5:
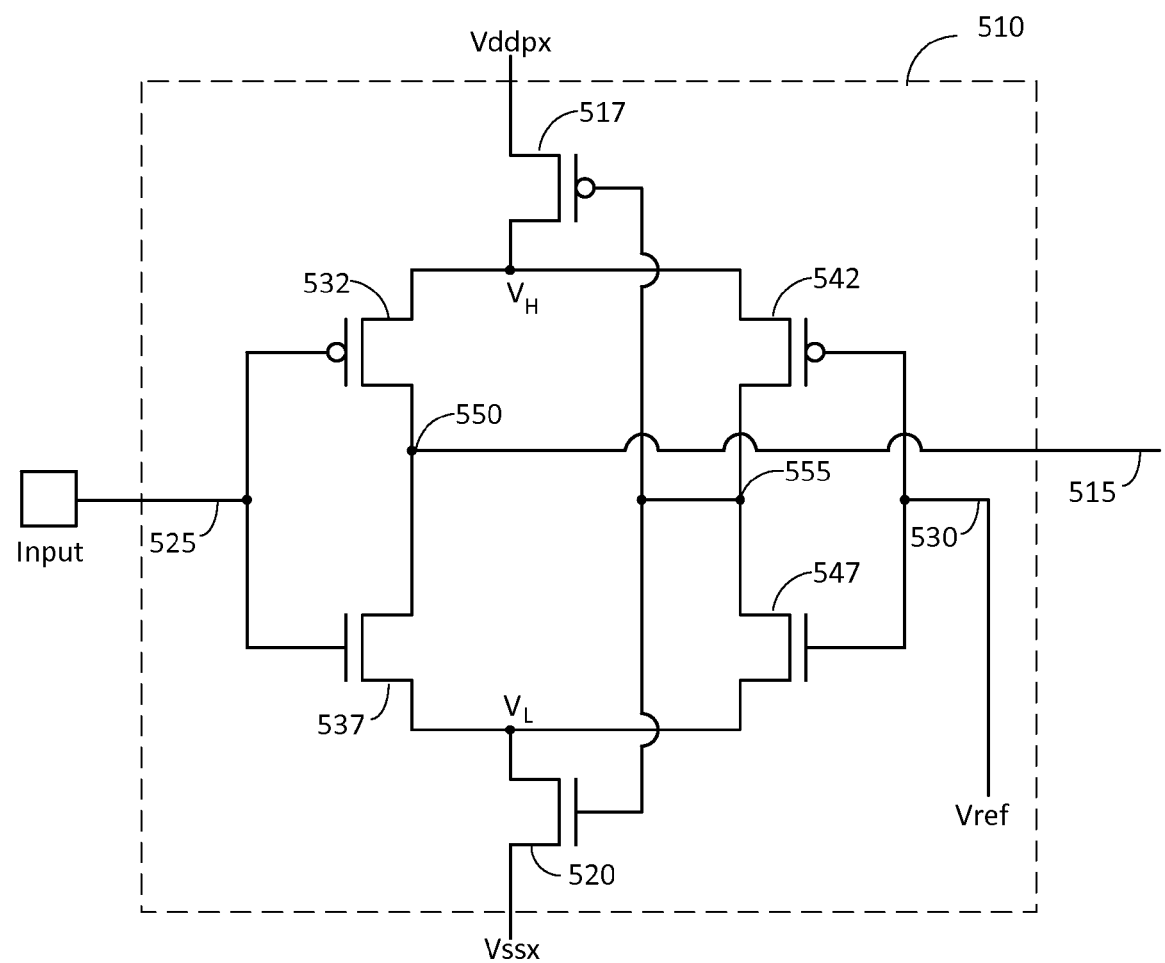
FIG. 5 shows a self-biased pseudo differential amplifier that may be used with embodiments of the present disclosure.

FIG. 5 shows an example of a self-biased pseudo differential amplifier 510 that may be used with embodiments of the present disclosure. The amplifier 510 may be used to implement the amplifier 110 shown in FIGS. 3 and 4. The amplifier 510 comprises a first current-bias transistor 517, a second current-bias transistor 520, a first complementary pair of amplifying transistors 532 and 537, and a second complementary pair of amplifying transistor 542 and 547. The first and second current-bias transistors 517 and 520 provide a bias current for the amplifying transistors 532, 537, 542 and 547.

The amplifier 510 has a first differential input 525 coupled to the gates of the first pair of amplifying transistors 532 and 537, and a second differential input 530 coupled to the gates of the second pair of amplifying transistors 542 and 547. The first differential input 525 is coupled to the input of the receiver, and the second differential input 530 is coupled to a reference voltage Vref. The output 550 of the first pair of amplifying transistors 532 and 537 is coupled to the output 515 of the amplifier 510, and therefore provides the amplified output of the amplifier 510. The output 555 of the second pair of gain transistor 542 and 547 is coupled to the gates of the first and second current-bias transistors 517 and 520 to provide self-biasing of the amplifier 510. This self-biasing creates a negative feedback loop that stabilizes the bias voltages of the amplifier 510.

The amplifier 510 has a high voltage of $V_H$ and a low voltage of $V_L$ at its output 515. The high voltage of $V_H$ is approximately equal to Vddpx minus a voltage drop across the first current-bias transistor 517 due to the bias current and the channel resistance of the first current-bias transistor 517. The low voltage $V_L$ is approximately equal to Vssx plus a voltage drop across the second current-bias transistor 520 due to the bias current and the channel resistance of the second current-bias transistor 520. Thus, the amplifier 510 has an output voltage swing of $V_H$ to $V_L$, which is lower than the full rail-to-rail voltage swing of Vddpx and Vssx. The reduced voltage swing at the amplifier output 515 may cause crowbar current to flow in an inverter (e.g., the inverter 120) that is driven by the amplifier 510. Embodiments of the present disclosure reduce the crowbar current, as discussed above, and therefore enable a receiver to use the amplifier 510 with reduced crowbar current.

It should be appreciated that the amplifier 510 shown in FIG. 5 is exemplary only, and that embodiments of the present disclosure may be used to reduce crowbar current caused by any amplifier having an output voltage swing that is lower than a full rail-to-rail voltage swing.

Figure 6:
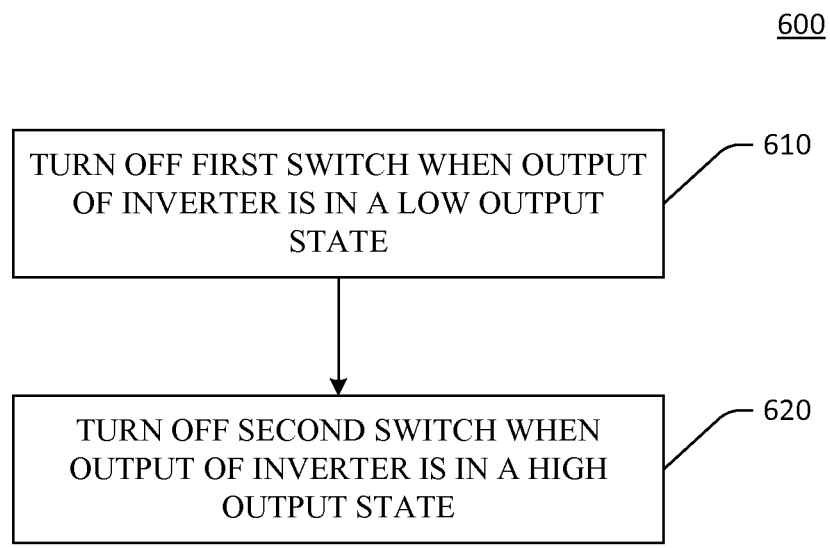
FIG. 6 is a flowchart illustrating a method for reducing crowbar current according to an embodiment of the present disclosure.

FIG. 6 is a flow diagram of a method 600 for reducing crowbar current according to an embodiment of the present disclosure. The method 600 may be performed in a circuit including an inverter (e.g., the first inverter 320) having an input and an output, a first switch (e.g., the first switch 340) coupled between a first power supply rail (e.g., Vddpx) and the inverter, and a second switch (e.g., the second switch 345) coupled between a second power supply rail (e.g., Vssx) and the inverter.

In step 610, the first switch is turned off when the output of the inverter is in a low output state. For example, the first switch may comprise a PMOS transistor having a source coupled to the first power supply rail, and a drain coupled to the inverter. In this example, the PMOS transistor of the first switch may be turned off when the output of the inverter is in the low output state by inverting the output of the inverter and inputting the inverted output of the inverter to a gate of the PMOS transistor. When the output of the inverter is in the low output state, the inverted output is in a high state, thereby turning off the PMOS transistor of the first switch.

In step 620, the second switch is turned off when the output of the inverter is in a high output state. For example, the second switch may comprise an NMOS transistor having a source coupled to the second power supply rail, and a drain coupled to the inverter. In this example, the NMOS transistor of the second switch may be turned off when the output of the inverter is in the high output state by inverting the output of the inverter and inputting the inverted output of the inverter to a gate of the NMOS transistor. When the output of the inverter is in the high output state, the inverted output is in a low state, thereby turning off the NMOS transistor of the second switch.

Those skilled in the art would appreciate that the circuits described herein may be realized using a variety of transistor types, and are therefore not limited to the particular transistor types shown in the figures. For example, transistor types such as bipolar junction transistors, junction field effect transistor or any other transistor type may be used. Those skilled in the art would also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

Those skilled in the art would also appreciate that various diode types may be used to implement the trigger devices described herein. Although the first trigger 440 comprises a diode-connected PMOS transistor in the example shown in FIG. 4, those skilled in the art would appreciate that the first trigger 440 may also be implemented using a pn-junction diode, a diode-connected NMOS transistor or any other diode type. Further, although the second trigger 445 comprises a diode-connected NMOS transistor in the example shown in FIG. 4, those skilled in the art would appreciate that the second trigger 445 may also be implemented using a pn-junction diode, a diode-connected PMOS transistor or any other diode type. Those skilled in the art would also appreciate that a trigger device may comprise more than one diode, such as two or more diodes connected in series.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A circuit for reducing crowbar current, comprising:
   an inverter having an input and an output;
   a first switch coupled between the inverter and a first power supply rail;
   a second switch coupled between the inverter and a second power supply rail;
   a feedback circuit coupled to the output of the inverter, wherein the feedback circuit is configured to turn off the first switch when the output of the inverter is in a low output state, and to turn off the second switch when the output of the inverter is in a high output state; and
   a diode-connected PMOS transistor coupled between the first power supply rail and the inverter, wherein the diode-connected PMOS transistor is configured to provide a current path between the first power supply rail and the inverter when the input of the inverter transitions from a high input state to a low input state.

2. The circuit of claim 1, wherein the first switch comprises a PMOS transistor having a source coupled to the first power supply rail, and a drain coupled to the inverter.

3. The circuit of claim 2, wherein the feedback circuit comprises a second inverter having an input coupled to the output of the first inverter, and an output coupled to a gate of the PMOS transistor of the first switch.

4. The circuit of claim 1, wherein the second switch comprises an NMOS transistor having a drain coupled to the first inverter, and a source coupled to the second power supply rail.

5. The circuit of claim 4, wherein the feedback circuit comprises a second inverter having an input coupled to the output of the first inverter, and an output coupled to a gate of the NMOS transistor of the second switch.

6. The circuit of claim 1, further comprising a trigger device coupled between the inverter and the second power supply rail, wherein trigger device is configured to provide a current path between the inverter and the second power supply rail when the input of the inverter transitions from the low input state to the high input state.

7. The circuit of claim 6, wherein the trigger devices comprises a diode.

8. The circuit of claim 7, wherein the diode comprises a diode-connected NMOS transistor.

9. The circuit of claim 1, wherein the feedback circuit is configured to turn on the first switch when the output of the inverter is in the high output state, and to turn on the second switch when the output of the inverter is in the low output state.

10. The circuit of claim 1, wherein the feedback circuit comprises a second inverter having an input coupled to the output of the first inverter, and an output coupled to the first and second switches.

11. The circuit of claim 1, wherein the inverter comprises:
a PMOS transistor having a source coupled to the first switch, a gate coupled to the input of the inverter, and a drain coupled to the output of the inverter; and
an NMOS transistor having a source coupled to the second switch, a gate coupled to the input of the inverter, and a drain coupled to the output of the inverter.

12. A method for reducing crowbar current in a circuit including an inverter having an input and an output, a first switch coupled between the inverter and a first power supply rail, and a second switch coupled between the inverter and a second power supply rail, the method comprising:
turning off the first switch when the output of the inverter is in a low output state;
turning off the second switch when the output of the inverter is in a high output state; and
providing a current path from the first power supply rail to the inverter when the input of the inverter transitions from a high input state to a low input state, wherein the current path bypasses the first switch and the current path is through a diode-connected PMOS transistor.

13. The method of claim 12, wherein the first switch comprises a PMOS transistor having a source coupled to the first power supply rail, and a drain coupled to the inverter, and wherein turning off the first switch comprises:
inverting the output of the inverter; and
inputting the inverted output of the inverter to a gate of the PMOS transistor.

14. The method of claim 12, wherein the second switch comprises an NMOS transistor having a drain coupled to the first inverter, and a source coupled to the second power supply rail, and wherein turning off the second switch comprises:
inverting the output of the inverter; and
inputting the inverted output of the inverter to a gate of the NMOS transistor.

15. The method of claim 12, further comprising:
providing a current path from the inverter to the second power supply rail when the input of the inverter transitions from a low input state to a high input state, wherein the current path bypasses the second switch.

16. The method of claim 12, further comprising:
turning on the first switch when the output of the inverter is in the high output state; and
turning on the second switch when the output of the inverter is in the low output state.

17. An apparatus for reducing crowbar current, comprising:
means for inverting a signal;
first means for switching coupled between the means for inverting and a first power supply rail;
second means for switching coupled between the means for inverting and a second power supply rail;
means for turning off the first means for switching when an output of the means for inverting is in a low output state;
means for turning off the second means for switching when the output of the means for inverting is in a high output state; and
means for providing a current path from the first power supply rail to the means for inverting when the input of the means for inverting transitions from a high input state to a low input state, wherein the current path bypasses the first means for switching and the means for providing the current path comprises a diode-connected PMOS transistor.

18. The apparatus of claim 17, wherein the first means for switching comprises a PMOS transistor having a source coupled to the first power supply rail, and a drain coupled to the means for inverting.

19. The apparatus of claim 18, wherein the means for turning off the first means for switching comprises:
means for inverting the output of the means for inverting the signal; and
means for inputting the inverted output of the means for inverting the signal to a gate of the PMOS transistor.

20. The apparatus of claim 17, wherein the second means for switching comprises an NMOS transistor having a drain coupled to the means for inverting, and a source coupled to the second power supply rail.

21. The apparatus of claim 20, wherein the means for turning off the second means for switching comprises:
means for inverting the output of the first means for inverting the signal; and
means for inputting the inverted output of the first means for inverting the signal to a gate of the NMOS transistor.

22. The apparatus of claim 17, further comprising:
means for providing a current path from the means for inverting to the second power supply rail when the input of the means for inverting transitions from a low input state to a high input state, wherein the current path bypasses the second means for switching.

23. The apparatus of claim 22, wherein the means for providing the current path comprises a diode.

24. The apparatus of claim 17, further comprising:
means for turning on the first means for switching when the output of the means for inverting is in the high output state; and
means for turning on the second means for switching when the output of the means for inverting is in the low output state.

* * * * *